United States Patent [19]

Schulze

[11] Patent Number: 5,902,135

[45] Date of Patent: *May 11, 1999

[54] METHOD FOR REMOVING CRYSTAL DEFECTS IN SILICON WAFERS

[75] Inventor: Hans-Joachim Schulze, Ottobrunn, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/730,878

[22] Filed: Oct. 18, 1996

[30] Foreign Application Priority Data

Oct. 19, 1995 [DE] Germany ............................ 195 38 983

[51] Int. Cl.⁶ .................................................. H01L 21/31
[52] U.S. Cl. ........................ 438/770; 438/556; 438/560; 438/787
[58] Field of Search ............................ 437/247; 438/297, 438/413, 445, 452, 505, 406, 556, 560, 770, 787

[56] References Cited

U.S. PATENT DOCUMENTS

| | | | |
|---|---|---|---|
| 5,162,247 | 11/1992 | Hazani | 437/43 |
| 5,244,843 | 9/1993 | Chau et al. | 437/239 |
| 5,407,838 | 4/1995 | Ohnishi et al. | 437/25 |
| 5,525,529 | 6/1996 | Guldi | 438/565 |
| 5,587,325 | 12/1996 | Comeau | 438/471 |
| 5,599,722 | 2/1997 | Sugisaka et al. | 437/21 |
| 5,792,699 | 6/1996 | Tsui | 438/290 |

OTHER PUBLICATIONS

Sigurd Wagner, et al., "Diffusion of Gallium Through Silicon Dioxide Films into Silicon", *J. Electrochem. Soc.: Solid–State Science and Technology*, vol. 121, No. 11, Nov. 1974, pp. 1487–1496.

P. H. Holloway et al., "Grain Boundary Diffusion of Phosphorous in Silicon", *J. Vac. Sci. Technol. A*, vol. 7, No. 3, May/Jun. 1989, pp. 1573–1578.

Z. Li, et al., "Gettering in High Resistive Float Zone Silicon Wafers for Silicon Detector Applications", *IEEE Transactions on Nuclear Science*, vol. 36, No. 1, Feb. 1989, pp. 290–294.

J–G. Park, et al., "Nature of D–Defect in CZ Silicon: D–Defect Dissolution and D–Defect Related T.D.D.B.", *Materials Science Forum*, vols. 196–201, (1995), pp. 1697–1706.

*Primary Examiner*—Charles Bowers
*Assistant Examiner*—Renee R. Berry
*Attorney, Agent, or Firm*—Hill & Simpson

[57] ABSTRACT

A method of removing vacancies in the crystal lattice of silicon wafers is provided. In particular, silicon wafers obtained from drawn rods have significantly higher defect densities in the central region as compared to the outer peripheries of the wafers. Before the diffusion of doping materials, the wafers are oxidized at a temperature that is generally lower than the diffusion temperature. As a result, the vacancies in the crystal lattice are filled with silicon which prevents the accumulation of heavy metals into the vacancies during the doping process. The performance and lifespan of the carrier in the central region of the wafers is thereby significantly increased.

9 Claims, No Drawings

METHOD FOR REMOVING CRYSTAL DEFECTS IN SILICON WAFERS

BACKGROUND OF THE INVENTION

1. Field of the Invention

The invention relates to a method for removing defects in the crystal lattice of silicon wafers cut from rod-like structures and into which doping materials are diffused at a predetermined temperatures.

2. Description of the Prior Art

Semiconductor components such as thyristors, GTO (gate turn-off) thyristors and diodes use semiconductor wafers that are cut from drawn monocrystalline silicon rods. Typically, the wafers are cut from the rods using a precision saw. Evaluations of such semiconductor wafers have shown that a significantly higher defect density is present in the central region of the wafers. These defects have a high probability of being accumulations of vacancies or voids, caused by the drawing process of the crystal.

If doping materials are diffused into such semiconductor wafers at a high temperature, e.g. 1240° C., heavy metals can settle or accumulate in these vacancies or voids. As a result, imperfections arise that lie deep in the silicon energy band. Such imperfections result in a reduced charge carrier lifetime within these central regions of the wafers. Consequently, high leakage currents can be generated, particularly for power semiconductors with significantly higher silicon thicknesses and considerably deeper space charge regions than other types of semiconductor components.

Accordingly, there is a need for a method for removing defects such as voids or vacancies in the central regions of silicon wafers that result in accumulated heavy metals in the central regions of silicon wafers.

SUMMARY OF THE INVENTION

The present invention solves the aforenoted problems by oxidizing semiconductor wafers on the surface before the diffusion of the doping materials. The oxidation is carried out at a temperature such that interstitial silicon atoms produced by this means diffuse into the disk from both sides of the silicon surface to a depth that corresponds to at least half the thickness of the disk.

The semiconductor wafers can be oxidized either in moist air or in a gaseous doping material compound containing oxygen. Phosphorus oxytrichloride ($POCl_3$) is one example of such an oxygen containing compound.

DETAILED DESCRIPTION OF THE PREFERRED METHODS

The oxidation can preferably be carried out at a temperature between 1100° C. and 1180° C. for a time period between two and five hours. Measurements have shown that the above-described defects in the central region of a disk with a thickness of 1.5 mm can be largely removed by carrying out a moist oxidation at a temperature of about 1150° C. for a time duration of about three hours. For a $POCl_3$ diffusion, a removal of the defects can be observed at a temperature of about 1150° C. and a time duration of about two and one-half hours.

The removal of the crystal defects is presumed to be a result of the formation of interstitial silicon at the border surface silicon/oxide during the surface oxidation of the silicon. By means of interstitial diffusion, the silicon moves very quickly into the interior of the silicon disk. The silicon occupies the vacancies in the crystal lattice, so that during the subsequent high-temperature doping steps, heavy metals cannot accumulate or settle in the vacancies of the crystal lattice.

After the diffusion with $POCl_3$, it is generally necessary to use etching to remove the phosphorous-doped zones that arise. However, since the thickness of the silicon wafers is reduced by the etching procedure, the initial thickness of the silicon wafers should be correspondingly increased.

Another method of removing the defects is the use of moist oxidation. In general, it is advisable to remove the oxide layer before the diffusion of the doping materials. This layer is about 1 $\mu m$ thick and can be removed without difficulty in a bath of hydrofluoric acid. Subsequent to the oxidation and the removal of the oxide layer, the doping materials necessary for the manufacture of a thyristor or of a diode, such as phosphorus, boron, gallium, aluminum, etc., are diffused at a generally higher temperature such as about 1240° C.

The specified method has proven useful for silicon wafers that are cut from a silicon rod manufactured in a "float zone" technology. However, the invention can also be used with silicon wafers cut from a silicon rod manufactured according to the Czochralski method or Tiegel method.

It should be understood that various changes and modifications to the presently preferred methods described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A method for removing defects in a crystal lattice of a two-sided silicon disk prior to diffusion of doping materials into the disk, the disk having a thickness, the method comprising the following steps in the sequence set forth:

oxidizing both sides of the disk at a temperature of at least 1100° C. and for a time period resulting in the diffusion of interstitial silicon atoms produced by the oxidation into both sides of the disk at a depth that corresponds to at least half the thickness of the disk and the formation of oxide layers on both sides of the disk, the diffusion of interstitial silicon atoms into the disk filling vacancies in the crystal lattice of the disk;

removing the oxide layers from both sides of the disk; and diffusing doping materials into the disk.

2. The method of claim 1 wherein the disk is cut from a drawn rod of silicon material.

3. The method of claim 1 wherein the oxidizing step is carried out in the presence of moist air.

4. The method of claim 1 wherein the oxidizing step is carried out in the presence of a gaseous doping material compound containing oxygen.

5. The method of claim 5 wherein the doping material compound is phosphorus oxytrichloride ($POCl_3$).

6. The method of claim 1 wherein the oxidizing step is carried out at a temperature ranging from about 1100° C. to about 1180° C.

7. The method of claim 1 wherein the oxidizing step is carried out over a time period ranging from about 2 hours to about 5 hours.

8. A method for filling vacancies in a crystal lattice of a two-sided silicon disk prior to diffusion of doping materials into the disk, the disk being cut from a drawn rod and having a thickness, the method comprising the following steps in the sequence set forth:

oxidizing both sides of the disk at a temperature of at least 1100° C. and in an atmosphere containing a gaseous doping material compound containing oxygen resulting in the diffusion of interstitial silicon atoms produced by the oxidation into both sides of the disk at a depth that corresponds to at least half the thickness of the disk thereby filling the vacancies in the crystal lattice of the disk and a diffusing of the doping material into the disk and a forming of oxide layers on both sides of the disk; and removing the oxide layers from both sides of the disk.

9. The method of claim 8 wherein the gaseous doping material compound containing oxygen is $POCl_3$ and the oxidizing step is carried out at a temperature of about 1150° C.

* * * * *